(12) United States Patent
Tango et al.

(10) Patent No.: US 11,444,575 B2
(45) Date of Patent: Sep. 13, 2022

(54) BIAS CIRCUIT

(71) Applicant: SUMITOMO ELECTRIC INDUSTRIES, LTD., Osaka (JP)

(72) Inventors: Hideki Tango, Yokohama (JP); Tatsuya Hashinaga, Yokohama (JP); Harutoshi Tsuji, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 61 days.

(21) Appl. No.: 17/147,845

(22) Filed: Jan. 13, 2021

(65) Prior Publication Data

US 2021/0135629 A1 May 6, 2021

Related U.S. Application Data

(63) Continuation of application No. 16/480,754, filed as application No. PCT/JP2017/006612 on Feb. 22, 2017, now Pat. No. 10,924,064.

(51) Int. Cl.
| | |
|---|---|
| *H03F 1/30* | (2006.01) |
| *H03F 1/02* | (2006.01) |
| *H03F 3/19* | (2006.01) |
| *H03M 1/66* | (2006.01) |

(52) U.S. Cl.
CPC ............. *H03F 1/0211* (2013.01); *H03F 1/30* (2013.01); *H03F 3/19* (2013.01); *H03F 2200/447* (2013.01); *H03F 2200/451* (2013.01); *H03F 2200/468* (2013.01); *H03M 1/66* (2013.01)

(58) Field of Classification Search
CPC ........................................................ H03F 1/30
See application file for complete search history.

(56) References Cited

U.S. PATENT DOCUMENTS

| | | | | |
|---|---|---|---|---|
| 5,619,386 A | * | 4/1997 | Voorman | G01R 33/09 |
| 2002/0118479 A1 | * | 8/2002 | Yoshizawa | G11B 5/02 |
| 2003/0214357 A1 | * | 11/2003 | Cho | H03G 1/007 |
| | | | | 330/282 |

(Continued)

FOREIGN PATENT DOCUMENTS

| | | |
|---|---|---|
| JP | H10-290129 A | 10/1998 |
| JP | 2003-008358 A | 1/2003 |

(Continued)

*Primary Examiner* — Patricia T Nguyen
(74) *Attorney, Agent, or Firm* — Faegre Drinker Biddle & Reath LLP

(57) ABSTRACT

Included are: a first power source 3 configured to output a voltage required for a first gate bias voltage for turning a power amplifier 2 to an ON state; a second power source 4 configured to output a voltage required for a second gate bias voltage for turning the power amplifier 2 to an OFF state; a changeover switch 5 connected between the first power source 3 and the power amplifier 2 and configured to supply either the first gate bias voltage or the second gate bias voltage to the power amplifier 2 by switching a state between the first power source 3 and the power amplifier 2 to either an open state or a short-circuit state on the basis of a control signal related to on-off control of the power amplifier 2; and a resistance value varying unit 15 connected between the second power source 4 and the power amplifier 2 and configured such that a resistance value thereof is variable.

3 Claims, 14 Drawing Sheets

(56) References Cited

U.S. PATENT DOCUMENTS

| | | |
|---|---|---|
| 2008/0048722 A1 | 2/2008 | Suzuki |
| 2008/0247338 A1 | 10/2008 | Kim et al. |
| 2010/0201449 A1 | 8/2010 | Hasegawa |
| 2013/0064021 A1 | 3/2013 | La Rosa |
| 2018/0026619 A1 | 1/2018 | Murao et al. |
| 2020/0014332 A1 | 1/2020 | Hageraats et al. |

FOREIGN PATENT DOCUMENTS

| | | |
|---|---|---|
| JP | 2010-103796 A | 5/2010 |
| WO | WO 2006/109731 A1 | 10/2006 |

\* cited by examiner

BIAS CIRCUIT

TECHNICAL FIELD

The present invention relates to a bias circuit.

BACKGROUND ART

In wireless communication of a mobile phone and the like, time division duplex (TDD) in which transmission and reception are switched in a time division manner is adopted in some cases.

On-off control of an amplifier for a wireless communication device used in TDD is performed such that an ON state where transmission and reception signals are amplified and outputted and an OFF state where output of transmission and reception signals is stopped are switched in accordance with a cycle of transmission and reception As a method for performing on-off control of an amplifier in which a field effect transistor (FET) is used, PATENT LITERATURE 1 below discloses a method for performing on-off control of the amplifier by turning on and off a switch provided between a drain terminal and a power source that supplies a drain voltage, and a method for performing on-off control of the amplifier by controlling a gate bias voltage to be supplied to a gate terminal.

In the method in which the switch between the power source and the drain terminal is turned on and off, a large-sized and expensive switching element that can handle high power has to be used as the switch.

Meanwhile, in the method in which the gate bias voltage to be supplied to the gate terminal is controlled, power to be controlled is relatively low, and thus there is an advantage in that a small-sized, inexpensive, and high-speed switching element can be used.

CITATION LIST

Patent Literature

PATENT LITERATURE 1: Japanese Laid-Open Patent Publication No. 2010-103796

SUMMARY OF INVENTION

A bias circuit according to one embodiment is a bias circuit configured to supply a gate bias voltage for performing on-off control of an amplifier, to the amplifier, the bias circuit including: a first power source connected in series to a gate terminal of the amplifier and configured to output a voltage required for a first gate bias voltage for turning the amplifier to an ON state; a second power source connected in series to the gate terminal of the amplifier and configured to output a voltage required for a second gate bias voltage for turning the amplifier to an OFF state; a changeover switch connected between the first power source and the amplifier and configured to supply either the first gate bias voltage or the second gate bias voltage to the amplifier by switching a state between the first power source and the amplifier to either an open state or a short-circuit state on the basis of a control signal related to on-off control of the amplifier; and a resistance value varying unit connected between the second power source and the amplifier and configured such that a resistance value thereof is variable.

In addition, a bias circuit according to another embodiment is a bias circuit configured to supply a gate bias voltage for performing on-off control of an amplifier, to the amplifier, the bias circuit including: a first power source connected in series to a gate terminal of the amplifier and configured to output a voltage required for a first gate bias voltage for turning the amplifier to an ON state; a second power source connected in series to the gate terminal of the amplifier and configured to output a voltage required for a second gate bias voltage for turning the amplifier to an OFF state; a changeover switch connected between the second power source and the amplifier and configured to supply either the first gate bias voltage or the second gate bias voltage to the amplifier by switching a state between the second power source and the amplifier to either an open state or a short-circuit state on the basis of a control signal related to on-off control of the amplifier; and a resistance value varying unit connected between the first power source and the amplifier and configured such that a resistance value thereof is variable.

DESCRIPTION OF EMBODIMENTS

[Problems to be Solved by Disclosure]

Figure 14:
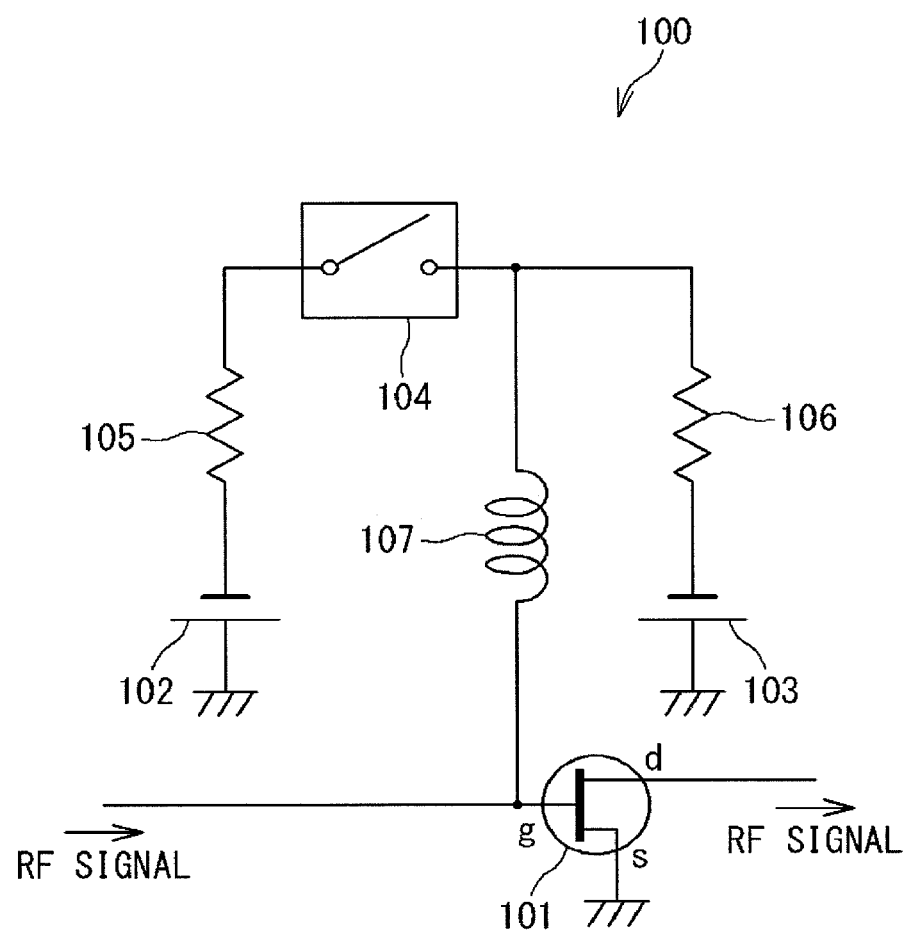
FIG. 14 is a diagram showing an example of a conventional bias circuit for controlling a gate bias voltage to be supplied to a gate terminal.

FIG. 14 is a diagram showing an example of a conventional bias circuit for controlling a gate bias voltage to be supplied to a gate terminal.

In FIG. 14, a bias circuit 100 is a circuit for supplying a gate bias voltage to an amplifier 101 for amplifying a radio frequency (RF) signal, and includes: a first power source 102 that is connected in series to the amplifier 101; a second power source 103 that is connected in series to the amplifier 101; a switch 104; a first resistor 105; a second resistor 106; and a coil 107 for blocking entry of the RF signal from the amplifier 101 to the bias circuit 100.

The amplifier 101 is turned to an ON state when a gate-source voltage thereof is a voltage Von higher than a pinch-off voltage, and is turned to an OFF state when the gate-source voltage is a voltage Voff lower than the pinch-off voltage.

The switch 104 is connected between the first power source 102 and the amplifier 101, and short-circuits the first power source 102 and the amplifier 101 or opens the part between the first power source 102 and the amplifier 101 in accordance with a control signal for on-off control of the amplifier 101.

When short-circuiting the first power source 102 and the amplifier 101, both the first power source 102 and the second power source 103 are connected to the amplifier 101, and the gate bias voltage is supplied to the amplifier 101. At this time, the gate bias voltage to be supplied is set to a voltage that can cause the gate-source voltage of the amplifier 101 to be the voltage Von, which is higher than the pinch-off voltage.

In addition, when opening the part between the first power source 102 and the amplifier 101, only the second power source 103 is connected to the amplifier 101, and the gate bias voltage is supplied to the amplifier 101. At this time, the gate bias voltage to be supplied is set to a voltage that can cause the gate-source voltage to be the voltage Voff, which is lower than the pinch-off voltage.

The first resistor 105 and the second resistor 106 protect both power sources, and resistance values thereof are set such that the gate bias voltage to be supplied to the amplifier 101 has an appropriate value.

When the switch 104 is in an open state, the gate-source voltage becomes the voltage Voff, and the amplifier 101 is turned to an OFF state.

On the other hand, when the switch 104 is in a short-circuit state, the gate-source voltage becomes the voltage Von, and the amplifier 101 is turned to an ON state.

As described above, the bias circuit 100 performs on-off control of the amplifier 101 by switching the switch 104.

Here, when the amplifier 101 is continuously operated while on-off control of the amplifier 101 is being performed, the internal temperature of the amplifier 101 rises and the gate current of the amplifier 101 increases in some cases.

When the gate current increases, voltage division occurs between the amplifier 101 and the resistor 105 (resistor 106), which are connected in series to each other, and the gate-source voltage fluctuates with respect to the preset voltages Von and Voff in some cases.

If the gate-source voltage fluctuates, there is a possibility that the amplifier 101 is not turned to an OFF state even when the switch 104 is in the open state, or an excessive current flows between the drain and the source of the amplifier 101 when the switch 104 is in the short-circuit state, and thus on-off control of the amplifier 101 cannot be appropriately performed.

The present disclosure has been made in view of the above circumstances, and an object of the present disclosure is to provide a bias circuit that can appropriately perform on-off control of an amplifier.

[Advantageous Effects of Disclosure]

The bias circuit according to the present disclosure can appropriately perform on-off control of the amplifier.

[Description of Embodiments]

First, contents of embodiments will be listed and described.

(1) A bias circuit according to one embodiment is a bias circuit configured to supply a gate bias voltage for performing on-off control of an amplifier, to the amplifier, the bias circuit including: a first power source connected in series to a gate terminal of the amplifier (via a coil for blocking an RF signal such that the RF signal does not enter the bias circuit) and configured to output a voltage required for a first gate bias voltage for turning the amplifier to an ON state; a second power source connected in series to the gate terminal of the amplifier (via a coil for blocking an RF signal such that the RF signal does not enter the bias circuit) and configured to output a voltage required for a second gate bias voltage for turning the amplifier to an OFF state; a changeover switch connected between the first power source and the amplifier and configured to supply either the first gate bias voltage or the second gate bias voltage to the amplifier by switching a state between the first power source and the amplifier to either an open state or a short-circuit state on the basis of a control signal related to on-off control of the amplifier; and a resistance value varying unit connected between the second power source and the amplifier and configured such that a resistance value thereof is variable.

(2) In addition, a bias circuit according to another embodiment is a bias circuit configured to supply a gate bias voltage for performing on-off control of an amplifier, to the amplifier, the bias circuit including: a first power source connected in series to a gate terminal of the amplifier and configured to output a voltage required for a first gate bias voltage for turning the amplifier to an ON state; a second power source connected in series to the gate terminal of the amplifier and configured to output a voltage required for a second gate bias voltage for turning the amplifier to an OFF state; a changeover switch connected between the second power source and the amplifier and configured to supply either the first gate bias voltage or the second gate bias voltage to the amplifier by switching a state between the second power source and the amplifier to either an open state or a short-circuit state on the basis of a control signal related to on-off control of the amplifier; and a resistance value varying unit connected between the first power source and the amplifier and configured such that a resistance value thereof is variable.

In the bias circuit having the above configuration, since the resistance value of the resistance value varying unit is variable, even if a gate current of the amplifier increases when the changeover switch is in the open state, the resistance value of the resistance value varying unit can be decreased, so that occurrence of voltage division due to a resistor for power source protection as in the above conventional example can be inhibited. As a result, occurrence of fluctuations of a gate-source voltage when the gate bias voltage is supplied can be inhibited. Accordingly, on-off control of the amplifier can be appropriately performed.

(3) Thus, in the above bias circuit, the resistance value of the resistance value varying unit is preferably lower when the changeover switch is in the open state than when the changeover switch is in the short-circuit state.

(4) In the above bias circuit, the resistance value varying unit preferably includes: a resistor connected between the first power source or the second power source and the amplifier; and an on/off switch configured to short-circuit or open both ends of the resistor on the basis of the control signal.

In this case, the resistance value of the resistance value varying unit can be switched by the on/off switch such that the resistance value obtained when the changeover switch is in the open state is different from that when the changeover switch is in the short-circuit state.

Thus, the resistance value of the resistance value varying unit obtained when the changeover switch is in the open state can be lower than the resistance value of the resistance value varying unit obtained when the changeover switch is in the short-circuit state. That is, when the changeover switch is in the open state, the on/off switch short-circuits both ends of the resistor, whereby occurrence of voltage division between the amplifier and the resistor can be inhibited even if the gate current of the amplifier increases. As a result, occurrence of fluctuations of the gate-source voltage when the gate bias voltage is supplied can be inhibited.

(5) In addition, in the above bias circuit, the resistance value varying unit may include: a variable resistor connected between the first power source or the second power source and the amplifier; and a resistor connected in parallel with the variable resistor, and the variable resistor may be a temperature-sensitive resistor.

In this case, even when the internal temperature of the amplifier rises and the gate current of the amplifier increases, if the resistance value of the temperature-sensitive resistor is decreased in accordance with the rise of the internal temperature, occurrence of voltage division between the amplifier and the resistor can be inhibited, and occurrence of fluctuations of the gate-source voltage can be inhibited.

(6) The bias circuit of the above (1) to (4) may further include a control unit configured to control the changeover switch and the resistance value varying unit on the basis of the control signal.

In this case, occurrence of fluctuations of the gate-source voltage can be inhibited by appropriately controlling the resistance value of the variable resistor.

(7) The bias circuit of the above (5) may further include a control unit configured to control the changeover switch on the basis of the control signal.

(8) In the above bias circuit, the first power source and the second power source may each be composed of an operational amplifier or a digital-analog converter.

[Details of Embodiments]

Hereinafter, preferred embodiments will be described with reference to the drawings.

It should be noted that at least some parts of the embodiments described below may be combined as desired.

[Configuration of Bias Circuit]

Figure 1:
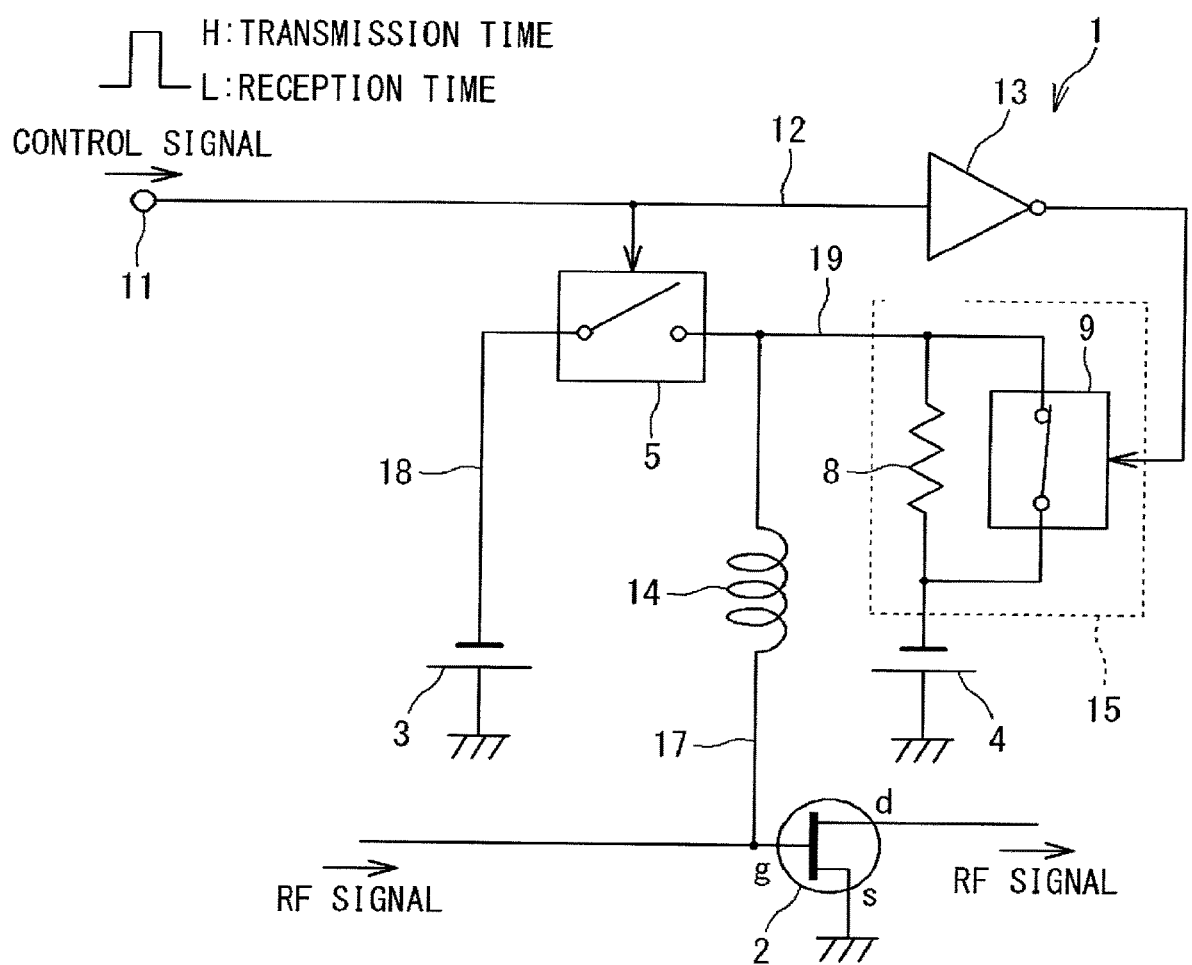
FIG. 1 is a circuit diagram showing a bias circuit according to a first embodiment.

FIG. 1 is a circuit diagram showing a bias circuit according to a first embodiment.

The bias circuit 1 is a circuit used in a wireless communication device such as a base station device in a mobile communication system, and supplies a control voltage for controlling a power amplifier 2.

A transmission signal having a radio frequency (RF signal) is provided to the power amplifier 2, and the power amplifier 2 amplifies and outputs the provided RF signal.

The bias circuit 1 is connected to a gate terminal g of the power amplifier 2, and supplies a gate bias voltage for performing on-off control of the power amplifier 2, to the power amplifier 2.

The bias circuit 1 includes a first power source 3, a second power source 4, and a changeover switch 5.

The first power source 3 is connected in series to the gate terminal g of the power amplifier 2. Similar to the first power source 3, the second power source 4 is also connected in series to the gate terminal g.

The first power source 3 is connected to the gate terminal g of the power amplifier 2 via: a line 17 extending from the gate terminal g of the power amplifier 2; and a first branch line 18 branching from an end portion of the line 17.

The second power source 4 is connected to the gate terminal g of the power amplifier 2 via: the line 17 extending from the gate terminal g of the power amplifier 2; and a second branch line 19 branching from the end portion of the line 17.

The first power source 3 and the second power source 4 each have a negative terminal connected to the gate terminal g of the power amplifier 2, and a grounded positive terminal.

A coil 14 for blocking the RF signal to be provided to the power amplifier 2 such that the RF signal does not enter the bias circuit 1 is connected to the line 17, which is shared for both the connection between the first power source 3 and the power amplifier 2 and the connection between the second power source 4 and the power amplifier 2.

The changeover switch 5 is connected between the first power source 3 and the power amplifier 2.

The changeover switch 5 is configured to be switchable to either a short-circuit state or an open state. The changeover switch 5 short-circuits the first power source 3 and the power amplifier 2 in the short-circuit state and opens the part between the first power source 3 and the power amplifier 2 in the open state.

When the changeover switch 5 is in the short-circuit state, the bias circuit 1 supplies a first voltage V1 for turning the power amplifier 2 to an ON state, as the gate bias voltage (first gate bias voltage) to the power amplifier 2 in a state where both the first power source 3 and the second power source 4 are connected to the power amplifier 2.

In addition, when the changeover switch 5 is in the open state, the bias circuit 1 connects the second power source 4 to the power amplifier 2 and supplies a second voltage V2 for turning the power amplifier 2 to an OFF state, as the gate bias voltage (second gate bias voltage) to the power amplifier 2.

Thus, the first power source 3 outputs a voltage required for supplying, to the power amplifier 2, the first voltage V1 for turning the power amplifier 2 to an ON state (a voltage required for the first voltage V1).

In addition, the second power source 4 outputs a voltage required for supplying, to the power amplifier 2, the first voltage V1 for turning the power amplifier 2 to an ON state and the second voltage V2 for turning the power amplifier 2 to an OFF state (a voltage required for the second voltage V2).

Figure 2:
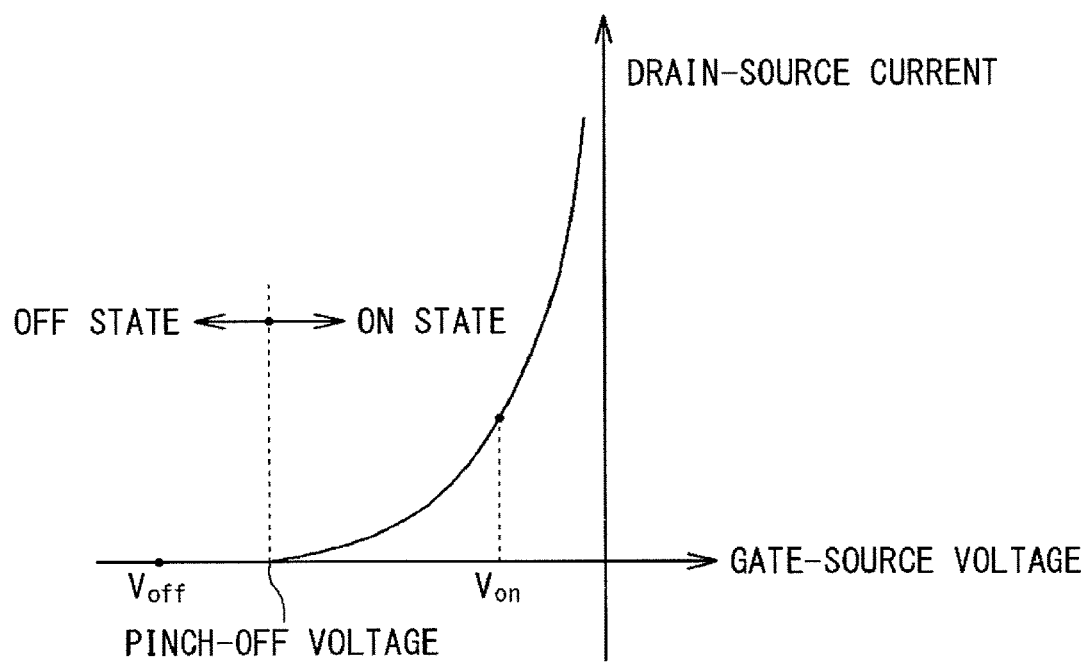
FIG. 2 is a graph showing an example of a relationship between a gate-source voltage and a drain-source current in a power amplifier 2.

FIG. 2 is a graph showing an example of a relationship between a gate-source voltage and a drain-source current in the power amplifier 2.

As shown in FIG. 2, the power amplifier 2 is turned to an ON state in a range where the gate-source voltage is higher than a pinch-off voltage at which the drain-source current is 0, and the power amplifier 2 is turned to an OFF state in a range where the gate-source voltage is lower than the pinch-off voltage.

In an ON state, the power amplifier 2 amplifies and outputs the provided RF signal. Meanwhile, in an OFF state, the power amplifier 2 does not output any signal and is turned to a stop state.

In the present embodiment, when the first voltage V1 is supplied as the gate bias voltage to the power amplifier 2, the gate-source voltage of the power amplifier 2 becomes a voltage Von that is higher than the pinch-off voltage. In addition, when the second voltage V2 is supplied as the gate bias voltage to the power amplifier 2, the gate-source voltage of the power amplifier 2 becomes a voltage Voff that is lower than the pinch-off voltage.

The bias circuit 1 switches the gate bias voltage to be supplied to the power amplifier 2, to either the first voltage V1 or the second voltage V2 using the changeover switch 5, thereby switching the gate-source voltage of the power amplifier 2 to either the voltage Von or the voltage Voff and switching the power amplifier 2 to either an ON state or an OFF state.

As shown in FIG. 1, the changeover switch 5 and the first power source 3 are connected to each other, not via a resistor or the like.

Meanwhile, a resistance value varying unit 15 is connected between the second power source 4 and the power amplifier 2.

The resistance value varying unit 15 is connected to the second branch line 19, and includes a second resistor 8 and a second bypass switch 9.

The second resistor 8 is connected in series between the second power source 4 and the power amplifier 2.

The second bypass switch 9 is connected to a bypass path bypassing both ends of the second resistor 8, and is connected in parallel with the second resistor 8.

The second bypass switch 9 is configured to be switchable to either a short-circuit state or an open state. The second bypass switch 9 short-circuits both ends of the second resistor 8 in the short-circuit state, and opens both ends of the second resistor 8 in the open state.

When the second bypass switch 9 opens both ends of the second resistor 8, the second power source 4 and the power amplifier 2 are connected to each other via the second resistor 8. In addition, when the second bypass switch 9 short-circuits both ends of the second resistor 8, the second power source 4 and the power amplifier 2 are connected to each other, not via the second resistor 8.

The changeover switch 5 and the second bypass switch 9 are configured to be switched to either a short-circuit state or open state on the basis of a control signal that is related to on-off control of the power amplifier 2 and that is provided to an input terminal 11.

The wireless communication device in which the bias circuit 1 of the present embodiment is used adopts TDD. In TDD, a transmission time when the wireless communication device transmits radio signals and a reception time when the wireless communication device receives radio signals from other communication devices are alternately switched in a time division manner.

The control signal provided to the input terminal 11 is a rectangular wave signal indicating a transmission time and a reception time of the wireless communication device. Periods when the control signal is at a high level (H level) indicate the transmission time, and periods when the control signal is at a low level (L level) indicate the reception time.

The control signal is provided to the changeover switch 5 and the second bypass switch 9 through a signal line 12 extending from the input terminal 11.

In addition, an inverter 13 is connected between a branch point leading to the changeover switch 5 and the second bypass switch 9 on the signal line 12. Thus, whereas the control signal is provided to the changeover switch 5, an inversion signal obtained by inverting the control signal is provided to the second bypass switch 9.

When the control signal provided to each of the changeover switch 5 and the second bypass switch 9 is at the L level, the changeover switch 5 and the second bypass switch 9 are turned to the open state; and when the control signal is at the H level, the changeover switch 5 and the second bypass switch 9 are turned to the short-circuit state. Thus, when the control signal is switched from the L level to the H level, the changeover switch 5 and the second bypass switch 9 are switched from the open state to the short-circuit state; and, when the control signal is switched from the H level to the L level, the changeover switch 5 and the second bypass switch 9 are switched from the short-circuit state to the open state.

Thus, when the control signal is at the L level at the input terminal 11, the changeover switch 5 is in the open state, the inversion signal is provided to the second bypass switch 9, and the second bypass switch 9 is turned to the short-circuit state.

On the other hand, when the control signal is at the H level at the input terminal 11, the changeover switch 5 is in the short-circuit state, and the second bypass switch 9 is turned to the open state.

As described above, the signal line 12 and the inverter 13 form a control unit for providing the control signal to the changeover switch 5 and the second bypass switch 9 and controlling switching operation of the changeover switch 5 and the second bypass switch 9.

[Operation of Bias Circuit]

Next, operation of the bias circuit 1 performed in accordance with the control signal will be described.

When the control signal provided to the bias circuit 1 is switched from the L level to the H level at the input terminal 11, the changeover switch 5 is switched from the open state to the short-circuit state, and the second bypass switch 9 is switched from the short-circuit state to the open state.

At this time, the first voltage V1 is supplied as the gate bias voltage to the power amplifier 2 in a state where both the first power source 3 and the second power source 4 are connected to the power amplifier 2.

Thus, when the control signal is switched to the H level, the bias circuit 1 controls the power amplifier 2 to an ON state.

In addition, the second power source 4 is connected to the power amplifier 2 via the second resistor 8. The resistance value of the second resistor 8 is set such that the gate bias voltage to be supplied to the power amplifier 2 becomes the first voltage V1.

Meanwhile, when the control signal is switched from the H level to the L level at the input terminal 11, the changeover switch 5 is switched from the short-circuit state to the open state, and the second bypass switch 9 is switched from the open state to the short-circuit state. That is, the state of each switch becomes the state shown in FIG. 1.

At this time, the part between the first power source 3 and the power amplifier 2 is opened, and the second power source 4 and the power amplifier 2 are connected to each other, not via the second resistor 8. In this case, the second voltage V2 is supplied to the power amplifier 2.

Thus, when the control signal is switched to the L level, the bias circuit 1 controls the power amplifier 2 to an OFF state.

As described above, when the control signal is at the H level (the transmission time), the bias circuit 1 switches the changeover switch 5 to the short-circuit state and turns the power amplifier 2 to an ON state. Moreover, when the control signal is at the L level (the reception time), the bias circuit 1 switches the changeover switch 5 to the open state and turns the power amplifier 2 to an OFF state.

In addition, in the present embodiment, when the changeover switch 5 is in the short-circuit state, the second power source 4 and the power amplifier 2 are connected to each other via the second resistor 8.

Moreover, when the changeover switch 5 is in the open state, the second power source 4 and the power amplifier 2 are connected to each other, not via the second resistor 8.

In other words, by the second bypass switch 9 being switched, a resistance value R1 between both ends of the resistance value varying unit 15 can be switched such that the resistance value R1 obtained when the changeover switch 5 is in the open state is different from that when the changeover switch 5 is in the short-circuit state.

As described above, the resistance value R1 of the resistance value varying unit 15 obtained when the changeover switch 5 is in the open state is different from that when the changeover switch 5 is in the short-circuit state.

In the bias circuit 1 of the present embodiment, the resistance value R1 obtained when the changeover switch 5 is in the open state is set so as to be lower than the resistance value R1 obtained when the changeover switch 5 is in the short-circuit state, since the second resistor 8 is bypassed by the second bypass switch 9.

Accordingly, when the changeover switch 5 is in the open state, since the second resistor 8 is bypassed by the second bypass switch 9 (on/off switch), even if the internal temperature of the power amplifier 2 rises and the gate current of the power amplifier 2 increases, occurrence of voltage division between the power amplifier 2 and the second resistor 8 can be inhibited. Thus, occurrence of fluctuations with respect to the voltage Voff that is the gate-source voltage when the gate bias voltage is supplied can be inhibited.

In addition, similarly, when the changeover switch 5 is in the short-circuit state, since the first power source 3 is connected to the power amplifier 2 not via a resistor or the like, even if the gate current of the power amplifier 2 increases, occurrence of voltage division between the power amplifier 2 and a resistor as in the above conventional example can be inhibited, and occurrence of fluctuations with respect to the voltage Von that is the gate-source voltage when the gate bias voltage is supplied can be inhibited.

Figure 3:
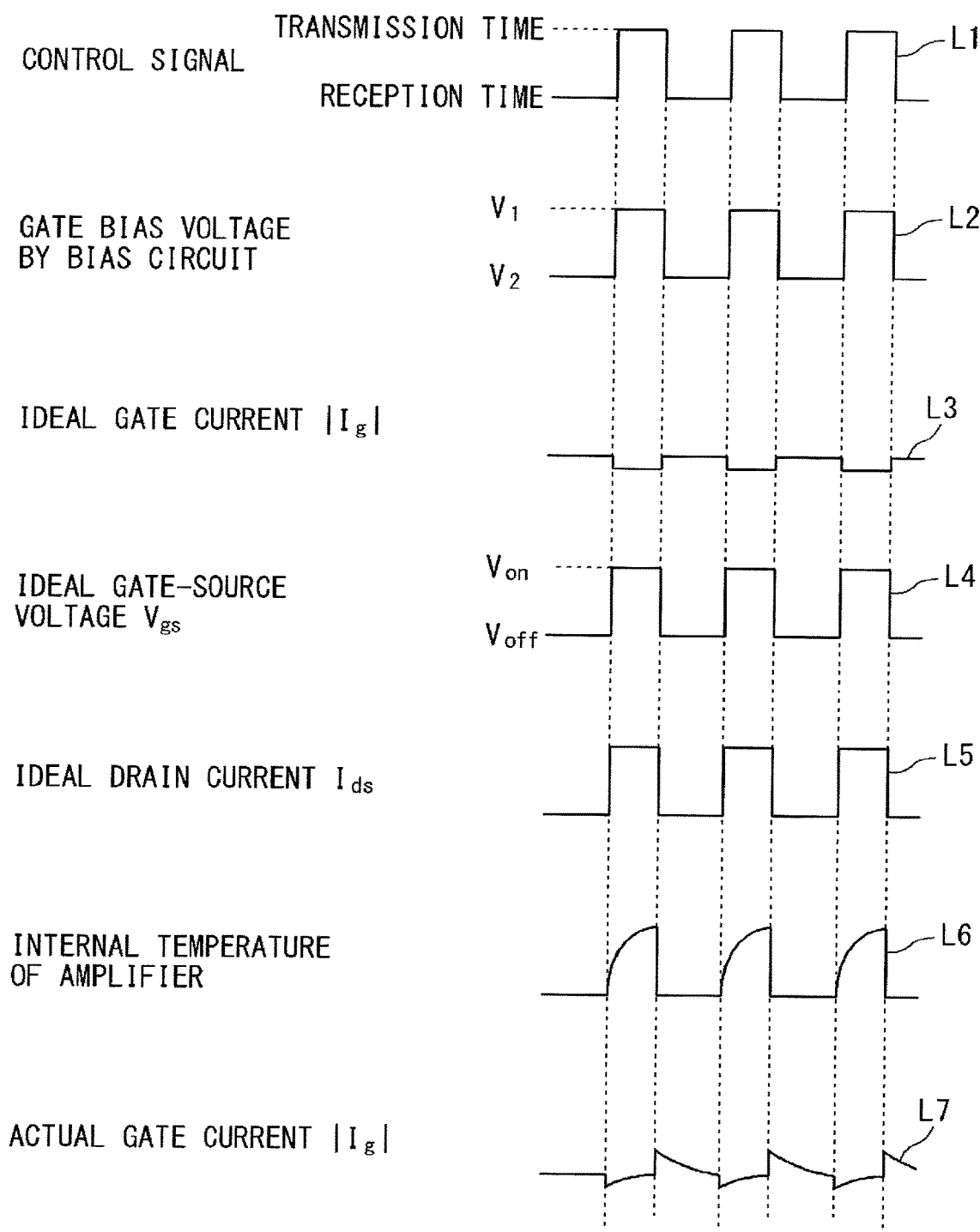
FIG. 3 is a diagram showing an example of value change of each section of the power amplifier when on-off control of the power amplifier is performed on the basis of a control signal.

FIG. 3 is a diagram showing an example of value change of each section of the power amplifier 2 when on-off control of the power amplifier 2 is performed on the basis of the control signal.

In FIG. 3, the horizontal axis represents time, and respective lines are shown so as to correspond to each other in the horizontal axis direction.

In FIG. 3, a line L1 represents voltage change of the control signal. A line L2 represents change of the gate bias voltage by the bias circuit 1, a line L3 represents change of the absolute value |Ig| of an ideal gate current, a line L4 represents change of an ideal gate-source voltage Vgs, a line L5 represents change of an ideal drain-source current Ids, a line L6 represents change of the internal temperature of the power amplifier 2, and a line L7 represents change of the absolute value |Ig| of the actual gate current.

In the present embodiment, as described above, the control signal is a rectangular wave in which the voltage level is switched between the H level and the L level, and the periods when the control signal is at the H level indicate the transmission time, and the periods when the control signal is at the L level indicate the reception time.

When the absolute value |Ig| of the gate current that is a current flowing through the gate terminal ideally changes in response to the voltage change of the control signal as shown by the line L3, the gate-source voltage Vgs and the drain-source current Ids ideally change in a rectangular wave shape in response to the control signal as shown by the line L4 and the line L5.

The gate-source voltage Vgs is alternately switched between the voltage Von and the voltage Voff in accordance with the control signal as shown by the line L4. Output and stop of the drain-source current Ids are repeated in accordance with the gate-source voltage Vgs, and the power amplifier 2 is appropriately switched between an ON state and an OFF state in accordance with the H level and the L level of the control signal.

Here, when the power amplifier 2 is in an ON state, the drain-source current Ids flows in the power amplifier 2, and thus the internal temperature of the power amplifier 2 rises. When the power amplifier 2 is in an OFF state, the power amplifier 2 stops amplification, and thus the internal temperature of the power amplifier 2 falls. Thus, as shown by the line L6, the internal temperature of the power amplifier 2 rises when the power amplifier 2 is switched from an OFF state to an ON state, and falls when the power amplifier 2 is switched from an ON state to an OFF state. The internal temperature of the power amplifier 2 repeatedly rises and falls in accordance with the voltage change of the control signal.

In addition, when the internal temperature of the power amplifier 2 changes, the gate current Ig changes.

Figure 4:
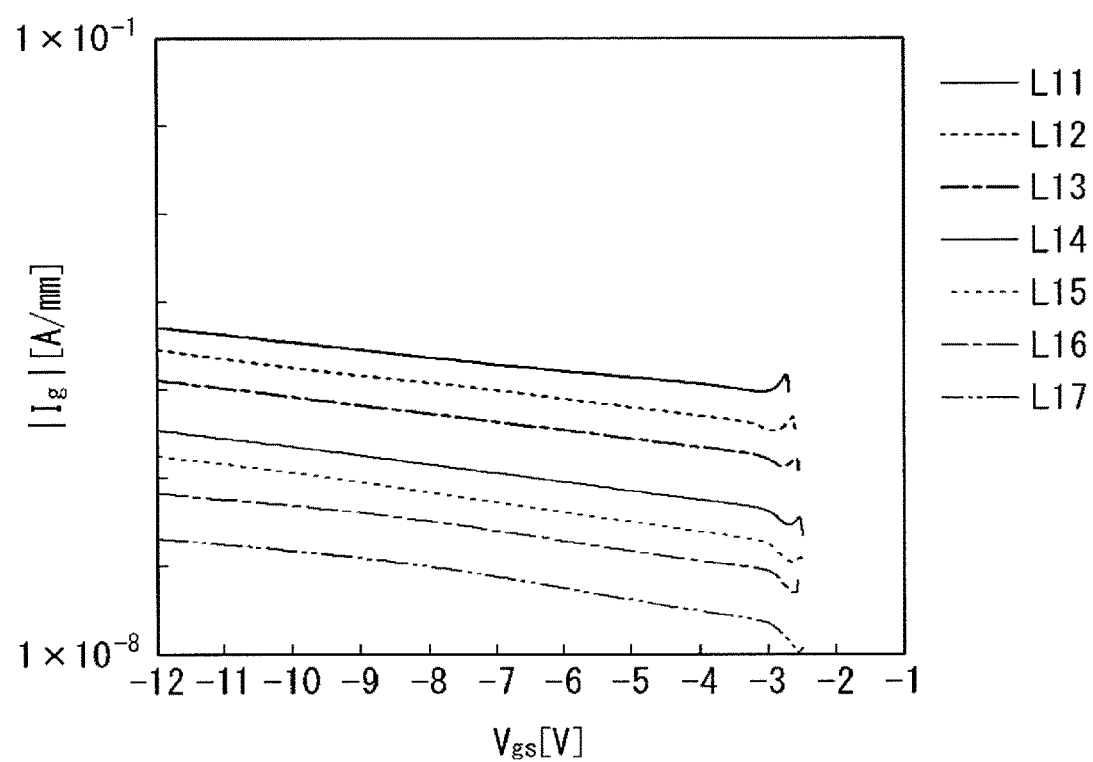
FIG. 4 is a graph showing change of a gate current with respect to the internal temperature of the power amplifier.

FIG. 4 is a graph showing change of the gate current Ig with respect to the internal temperature of the power amplifier 2. In FIG. 4, the horizontal axis represents the gate-source voltage Vgs, and the vertical axis represents the absolute value |Ig| of the gate current.

In addition, a line L11 represents a relationship established when the internal temperature of the power amplifier 2 is 200° C. Similarly, a line L12 represents a relationship established when the internal temperature is 150° C., a line L13 represents a relationship established when the internal temperature is 100° C., a line L14 represents a relationship established when the internal temperature is 50° C., a line L15 represents a relationship established when the internal temperature is 25° C., a line L16 represents a relationship established when the internal temperature is 0° C., and a line L17 represents a relationship established when the internal temperature is −30° C.

It is found that, as shown in FIG. 4, the absolute value |Ig| of the gate current of the power amplifier 2 increases with rise of the internal temperature of the power amplifier 2 even when the gate-source voltage Vgs has an identical value.

Therefore, as shown by the line L7 in FIG. 3, the absolute value |Ig| of the actual gate current of the power amplifier 2 gradually increases with rise of the internal temperature of the power amplifier 2 immediately after the control signal is switched from the L level to the H level and the changeover switch 5 is switched from the open state to the short-circuit state.

In addition, when the control signal is switched from the H level to the L level, the absolute value |Ig| of the actual gate current of the power amplifier 2 gradually decreases due to fall of the internal temperature by the amount equal to the increase achieved when the control signal is at the H level.

In other words, it is found that, as shown in FIG. 3, the absolute value |Ig| of the gate current Ig fluctuates by repeatedly increasing and decreasing by the amount equal to the increase due to rise of the internal temperature of the power amplifier 2.

Figure 5:
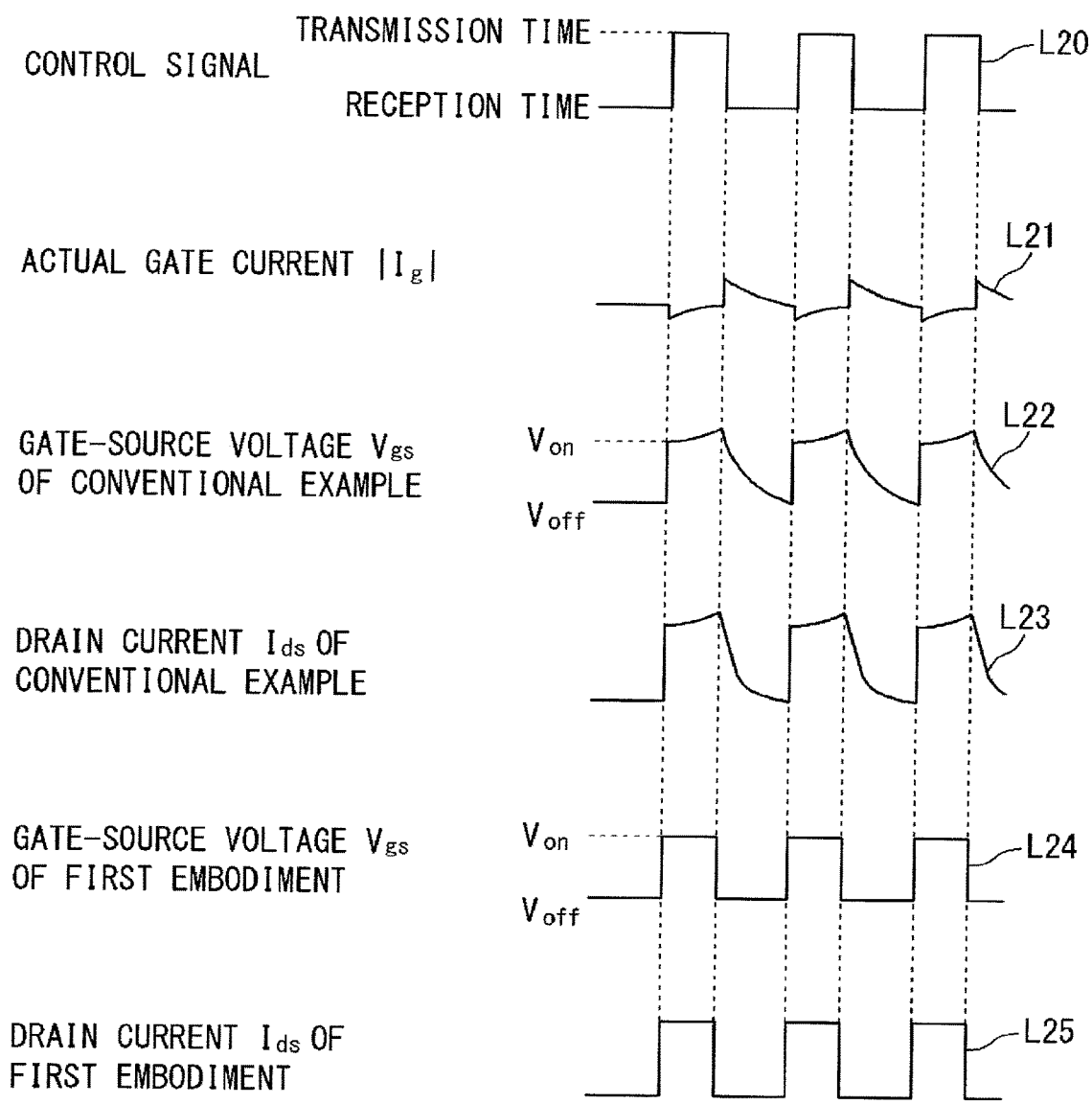
FIG. 5 is a diagram showing change of a gate-source voltage and a drain-source current when on-off control of the power amplifier is performed by each of the bias circuit of the embodiment and a conventional bias circuit.

FIG. 5 is a diagram showing change of the gate-source voltage Vgs and the drain-source current Ids when on-off control of the power amplifier 2 is performed by each of the bias circuit 1 of the present embodiment and a conventional bias circuit.

In FIG. 5, a line L20 represents a control signal, a line L21 represents change of the absolute value |Ig| of the actual gate current, and the line L20 and the line L21 are the same as the line L1 and the line L7 in FIG. 3.

A line L22 represents change of the gate-source voltage Vgs when on-off control of the power amplifier is performed by the conventional bias circuit shown in FIG. 14, and a line L23 represents change of the drain-source current Ids when on-off control of the power amplifier is performed by the conventional bias circuit.

In the conventional bias circuit, when the absolute value |Ig| of the gate current Ig increases as shown by the line L21 due to rise of the internal temperature of the power amplifier, voltage division occurs between the amplifier 101 and the resistor 105 (resistor 106), which are connected in series to each other (FIG. 14), and the gate-source voltage Vgs, which is controlled to be the voltage Von or the voltage Voff by the gate bias voltage, fluctuates.

As shown by the line L22 in FIG. 5, immediately after the control signal is switched from the L level to the H level (immediately after the changeover switch 5 is switched from the open state to the short-circuit state), the gate-source voltage Vgs gradually increases in accordance with increase of the absolute value |Ig| of the gate current and becomes higher than the voltage Von.

In addition, when the control signal is switched from the H level to the L level and the changeover switch 5 is switched from the short-circuit state to the open state, the gate-source voltage Vgs is not immediately switched to the voltage Voff, but gradually decreases from the voltage Von toward the voltage Voff. This is because, even when the control signal is switched from the H level to the L level, the absolute value |Ig| gradually decreases by the amount equal to the increase of the absolute value |Ig| achieved when the control signal is at the H level.

As described above, when the absolute value |Ig| of the gate current Ig increases due to rise of the internal temperature of the power amplifier 101 (FIG. 14), the gate-source voltage Vgs fluctuates with respect to the voltage Von and the voltage Voff in the conventional bias circuit.

More specifically, the gate-source voltage Vgs higher than the voltage Voff may be supplied when the changeover switch 104 (FIG. 14) is switched to the open state, or the gate-source voltage Vgs higher than the preset voltage Von may be supplied when the changeover switch 5 is switched to the short-circuit state.

As a result, as shown by the line L23 in FIG. 5, when the control signal is at the L level, the power amplifier 101 may output a signal although the power amplifier 101 is originally controlled to an OFF state, and, when the control signal is at the H level, an excessive current may flow between the drain and the source of the power amplifier 101.

Meanwhile, in the bias circuit 1 of the present embodiment, when the changeover switch 5 is in the open state, since the second resistor 8 is bypassed, even if the internal temperature of the power amplifier 2 rises and the gate current Ig of the power amplifier 2 increases, occurrence of voltage division between the power amplifier 2 and the second resistor 8 can be inhibited, and the gate-source voltage Vgs when the gate bias voltage is supplied can be inhibited from increasing and fluctuating.

In addition, similarly, when the changeover switch 5 is in the short-circuit state, since the first power source 3 is connected to the power amplifier 2 not via a resistor or the like, even if the internal temperature of the power amplifier 2 rises and the gate current Ig of the power amplifier 2 increases, occurrence of voltage division between the power amplifier 2 and a resistor as in the above conventional example can be inhibited, and the gate-source voltage Vgs when the gate bias voltage is supplied can be inhibited from increasing and fluctuating.

In other words, in the bias circuit 1 of the present embodiment, since the resistance value R1 between both ends of the resistance value varying unit 15 is variable, even if the gate current Ig of the power amplifier 2 increases when the changeover switch 5 is in the open state, the resistance value R1 can be decreased, so that occurrence of voltage division due to a resistor for power source protection as in the above conventional example can be inhibited. As a result, occurrence of fluctuations of the gate-source voltage Vgs when the gate bias voltage is supplied can be inhibited, and the gate-source voltage Vgs can be set to a value close to the voltage Voff.

On the other hand, when the changeover switch 5 is in the short-circuit state, the first power source 3 is connected to the power amplifier 2, and the second power source 4 is also connected to the power amplifier 2 via the second resistor 8. At this time, the resistance value of the second resistor 8 is appropriately set such that the gate-source voltage Vgs becomes the voltage Von.

Thus, the gate-source voltage Vgs and the drain-source current Ids of the present embodiment change in substantially a rectangular wave shape in response to the control signal as shown by a line L24 and a line L25 in FIG. 5. That is, the power amplifier 2 is appropriately switched between an ON state and an OFF state in accordance with the H level and the L level of the control signal.

As described above, the bias circuit 1 of the present embodiment can appropriately perform on-off control of the power amplifier 2.

[Other Embodiments]

Figure 6:
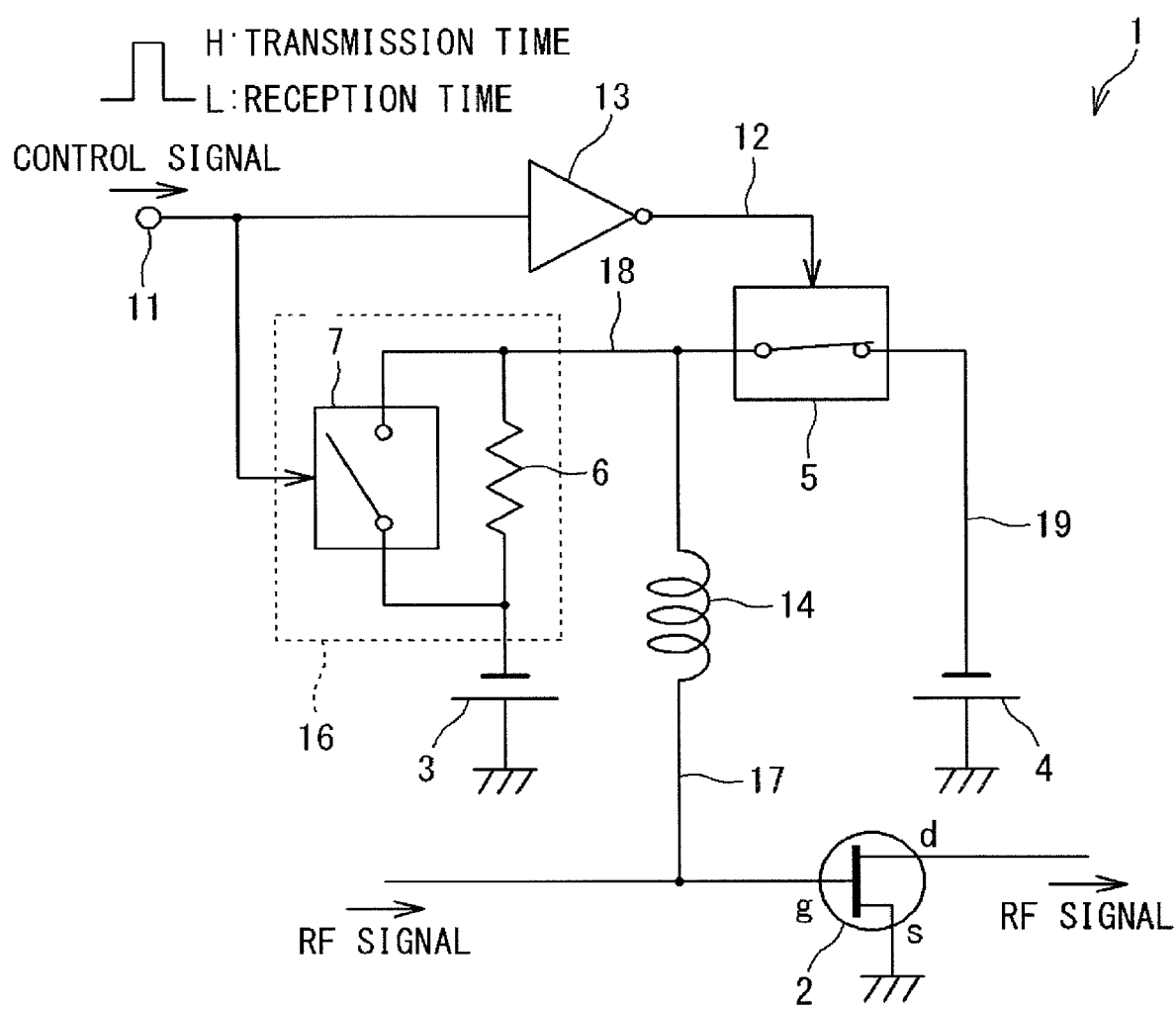
FIG. 6 is a circuit diagram showing a bias circuit according to a second embodiment.

FIG. 6 is a circuit diagram showing a bias circuit 1 according to a second embodiment.

The present embodiment is different from the first embodiment in that the changeover switch 5 is connected between the second power source 4 and the power amplifier 2 and in that a resistance value varying unit 16 is connected between the first power source 3 and the power amplifier 2.

As shown in FIG. 6, the changeover switch 5 and the second power source 4 are connected to each other, not via a resistor or the like.

Meanwhile, the resistance value varying unit 16 is connected between the first power source 3 and the power amplifier 2.

The resistance value varying unit 16 is connected to the first branch line 18, and includes a first resistor 6 and a first bypass switch 7.

The first resistor 6 is connected in series between the first power source 3 and the power amplifier 2.

The first bypass switch 7 is connected to a bypass path bypassing both ends of the first resistor 6, and is connected in parallel with the first resistor 6.

The first bypass switch 7 is configured to be switchable to either a short-circuit state or an open state. The first bypass switch 7 short-circuits both ends of the first resistor 6 in the short-circuit state, and opens both ends of the first resistor 6 in the open state.

When the first bypass switch 7 opens both ends of the first resistor 6, the first power source 3 and the power amplifier 2 are connected to each other via the first resistor 6. In addition, when the first bypass switch 7 short-circuits both ends of the first resistor 6, the first power source 3 and the power amplifier 2 are connected to each other, not via the first resistor 6.

Similar to the changeover switch 5 and the second bypass switch 9, the first bypass switch 7 is turned to the open state when a control signal provided to the first bypass switch 7 is at an L level, and is turned to the short-circuit state when the control signal is at an H level.

The inverter 13 is connected between a branch point leading to the resistance value varying unit 16 (first bypass switch 7) and the changeover switch 5 on the signal line 12. Accordingly, whereas the control signal is provided to the resistance value varying unit 16, an inversion signal obtained by inverting the control signal is provided to the changeover switch 5.

Thus, when the control signal provided to the bias circuit 1 of the present embodiment is switched from the H level to the L level at the input terminal 11, the changeover switch 5 is switched from the open state to the short-circuit state, and the first bypass switch 7 is switched from the short-circuit state to the open state. That is, the state of each switch becomes the state shown in FIG. 6.

At this time, the second voltage V2 is supplied as the gate bias voltage to the power amplifier 2 in a state where both the first power source 3 and the second power source 4 are connected to the power amplifier 2. Thus, the bias circuit 1 controls the power amplifier 2 to an OFF state.

In addition, the first power source 3 is connected to the power amplifier 2 via the first resistor 6. The resistance value of the first resistor 6 is set such that the gate bias voltage to be supplied to the power amplifier 2 becomes the second voltage V2.

Meanwhile, when the control signal is switched from the L level to the H level at the input terminal 11, the changeover switch 5 is switched from the short-circuit state to the open state, and the first bypass switch 7 is switched from the open state to the short-circuit state.

At this time, the part between the second power source 4 and the power amplifier 2 is opened, and the first power source 3 and the power amplifier 2 are connected to each other, not via the first resistor 6. In this case, the first voltage V1 is supplied to the power amplifier 2. Thus, the bias circuit 1 controls the power amplifier 2 to an ON state.

Thus, in the present embodiment, the first power source 3 outputs a voltage required for supplying, to the power amplifier 2, the first voltage V1 for turning the power amplifier 2 to an ON state and the second voltage V2 for turning the power amplifier 2 to an OFF state (a voltage required for the first voltage V1).

In addition, the second power source 4 outputs a voltage required for supplying, to the power amplifier 2, the second voltage V2 for turning the power amplifier 2 to an OFF state (a voltage required for the second voltage V2).

In the bias circuit 1 of the present embodiment, by the first bypass switch 7 being switched, a resistance value R2 between both ends of the resistance value varying unit 16 can be switched such that the resistance value R2 obtained when the changeover switch 5 is in the open state is different from that when the changeover switch 5 is in the short-circuit state.

As described above, the resistance value R2 of the resistance value varying unit 16 obtained when the changeover switch 5 is in the open state is different from that when the changeover switch 5 is in the short-circuit state.

In the bias circuit 1 of the present embodiment, the resistance value R2 obtained when the changeover switch 5 is in the open state is set so as to be lower than the resistance value R2 obtained when the changeover switch 5 is in the short-circuit state, since the first resistor 6 is bypassed by the first bypass switch 7 (on/off switch).

In the bias circuit 1 of the present embodiment as well, since the resistance value R2 between both ends of the resistance value varying unit 16 is variable, even if the gate current Ig of the power amplifier 2 increases when the changeover switch 5 is in the open state, the resistance value R2 can be decreased, so that occurrence of voltage division due to a resistor for power source protection as in the above conventional example can be inhibited. As a result, occurrence of fluctuations of the gate-source voltage Vgs when the gate bias voltage is supplied can be inhibited, and on-off control of the power amplifier 2 can be appropriately performed.

Figure 7:
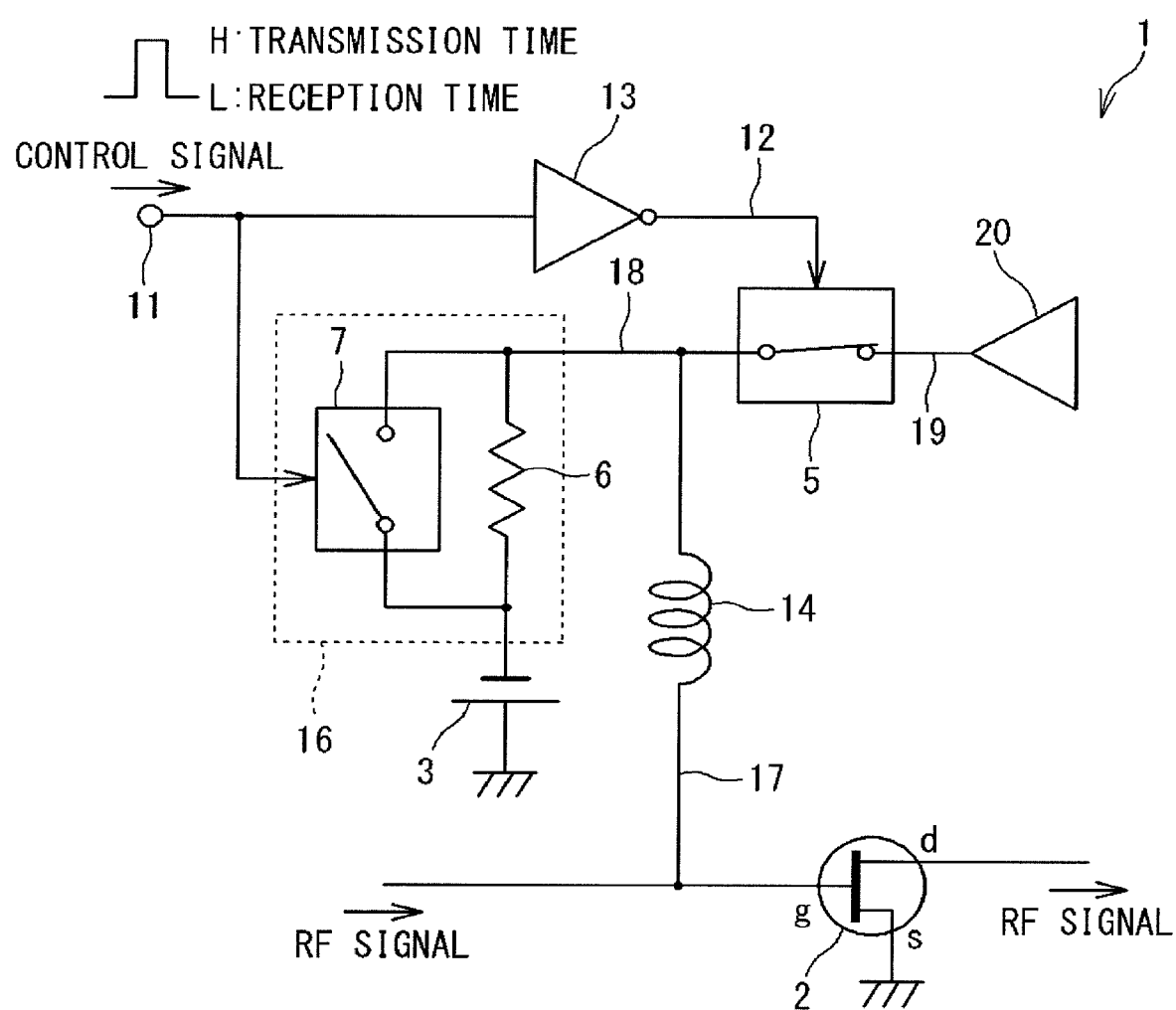
FIG. 7 is a circuit diagram showing a bias circuit according to a third embodiment.

FIG. 7 is a circuit diagram showing a bias circuit 1 according to a third embodiment.

The bias circuit 1 according to the third embodiment is different from that of the second embodiment in that an operational amplifier 20 is connected to the changeover switch 5 instead of the second power source 4. The other points are the same as in the second embodiment.

In the present embodiment, the operational amplifier 20 is set such that the operational amplifier 20 outputs the same voltage as that of the second power source 4 in the second embodiment.

In this configuration as well, similar to the second embodiment, on-off control of the power amplifier 2 can be appropriately performed.

Figure 8:
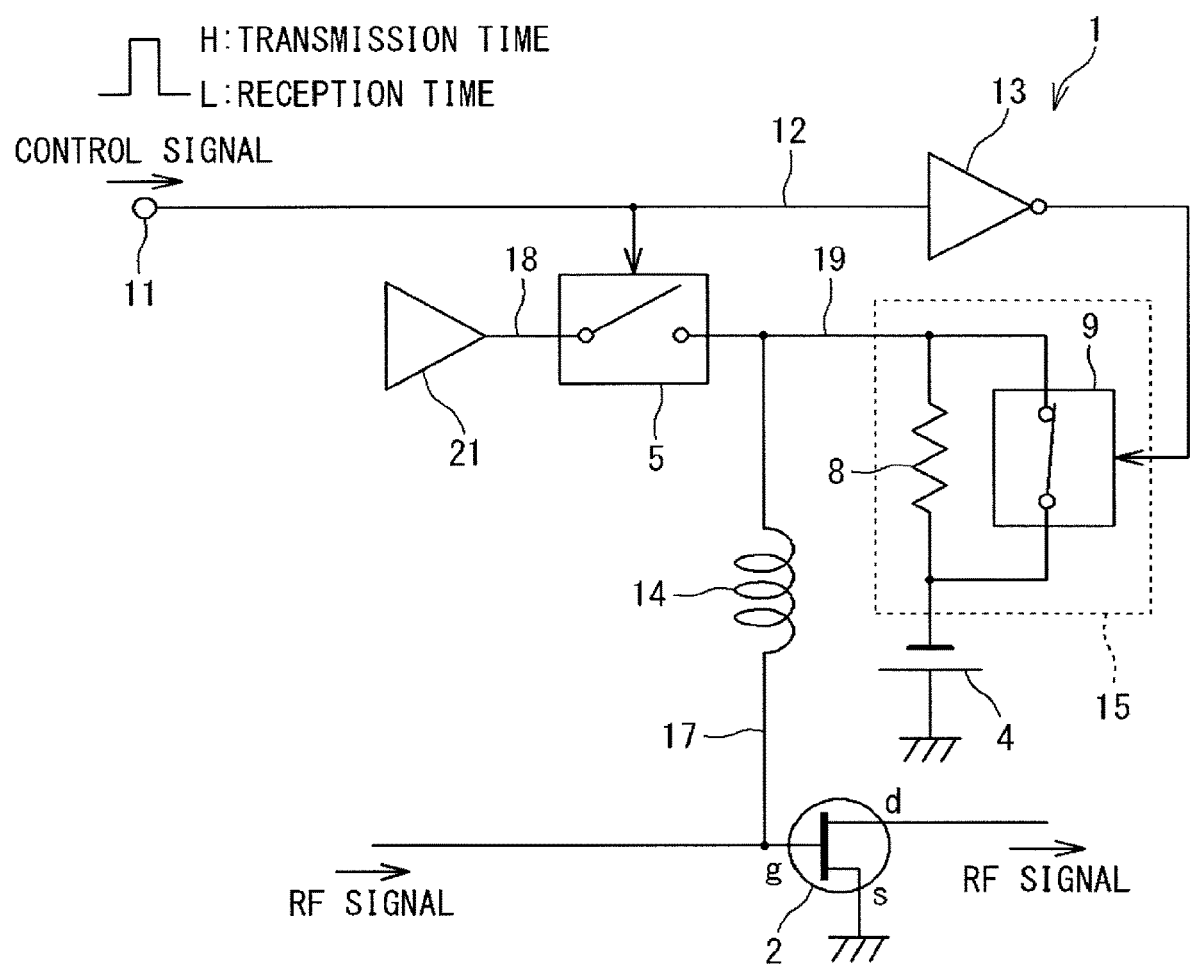
FIG. 8 is a circuit diagram showing a bias circuit according to a fourth embodiment.

FIG. 8 is a circuit diagram showing a bias circuit 1 according to a fourth embodiment.

The bias circuit 1 according to the fourth embodiment is different from that of the first embodiment in that an operational amplifier 21 is connected to the changeover switch 5 instead of the first power source 3. The other points are the same as in the first embodiment.

In the present embodiment, the operational amplifier 21 is set such that the operational amplifier 21 outputs the same voltage as that of the first power source in the first embodiment.

In this configuration as well, similar to the first embodiment, on-off control of the power amplifier 2 can be appropriately performed.

The operational amplifiers 20 and 21 used in the third embodiment and the fourth embodiment only need to be able to output a constant voltage, and, for example, a digital-analog converter may be used.

Figure 9:
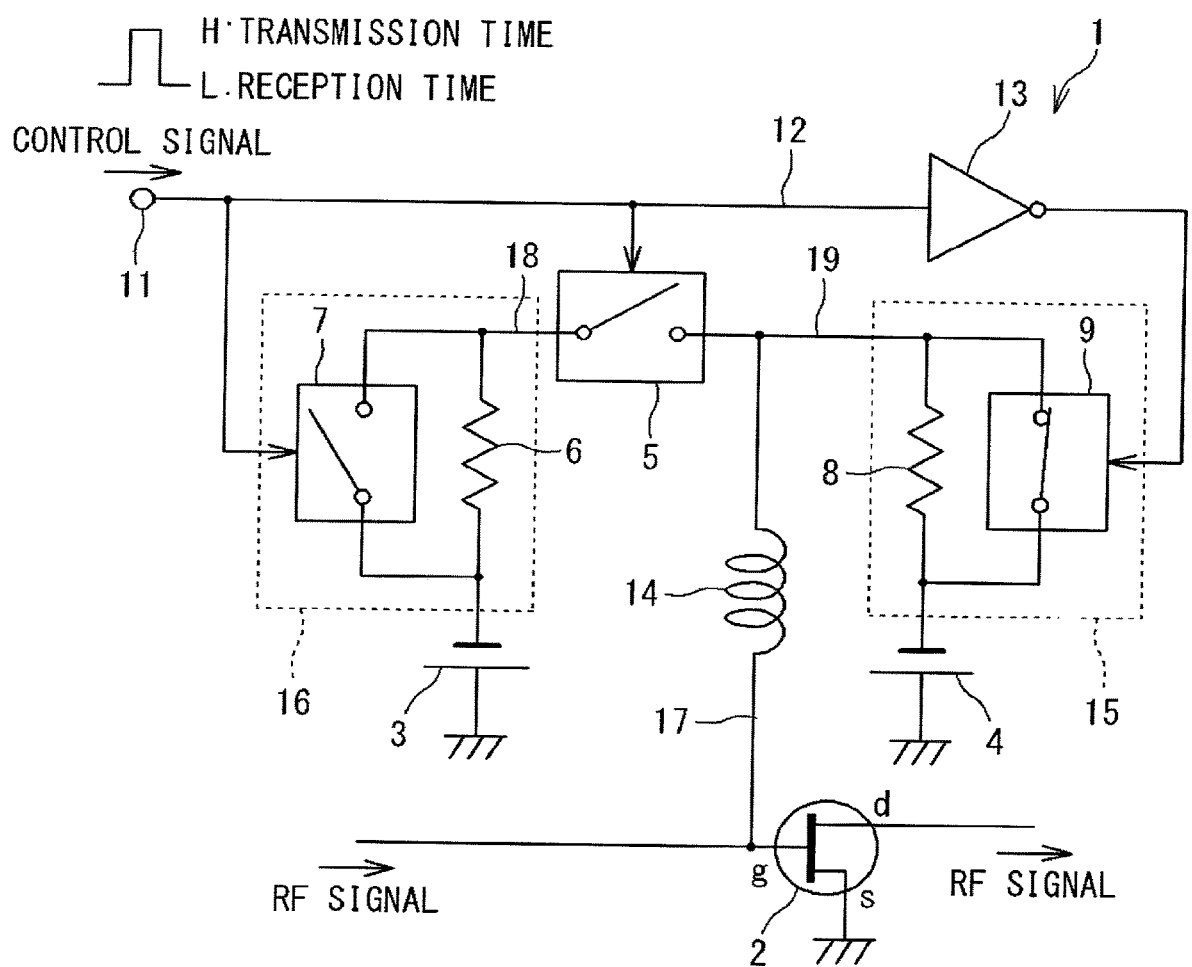
FIG. 9 is a circuit diagram showing a bias circuit according to a fifth embodiment.

FIG. 9 is a circuit diagram showing a bias circuit 1 according to a fifth embodiment.

The fifth embodiment is different from the first embodiment in that the resistance value varying unit 16 shown in the second embodiment is connected between the changeover switch 5 and the first power source 3 in the bias circuit 1 of the first embodiment. The other points are the same as in the first embodiment.

A control signal provided to the input terminal 11 is provided to the first bypass switch 7 of the resistance value varying unit 16 as is, i.e., without being inverted. Thus, the first bypass switch 7 is turned to the short-circuit state when the changeover switch 5 is in the short-circuit state, and is turned to the open state when the changeover switch 5 is in the open state.

In the present embodiment, since the first bypass switch 7 is also turned to the short-circuit state when the changeover switch 5 is in the short-circuit state, the first resistor 6 is constantly bypassed when the voltage from the first power source 3 is supplied to the power amplifier 2.

In this case, the first resistor 6 of the resistance value varying unit 16 can be caused to serve as a protective resistor for protecting the first power source 3 when a situation where a large current flows through the first power source 3 occurs for some reason.

In this configuration as well, similar to the first embodiment, on-off control of the power amplifier 2 can be appropriately performed.

In the present embodiment, the case where the first resistor 6 and the first bypass switch 7 are connected between the changeover switch 5 and the first power source 3 has been described. However, the first bypass switch 7 may be omitted, and the changeover switch 5 and the first power source 3 may be connected to each other via the first resistor 6 and a bypass path bypassing both ends of the first resistor 6.

Figure 10:
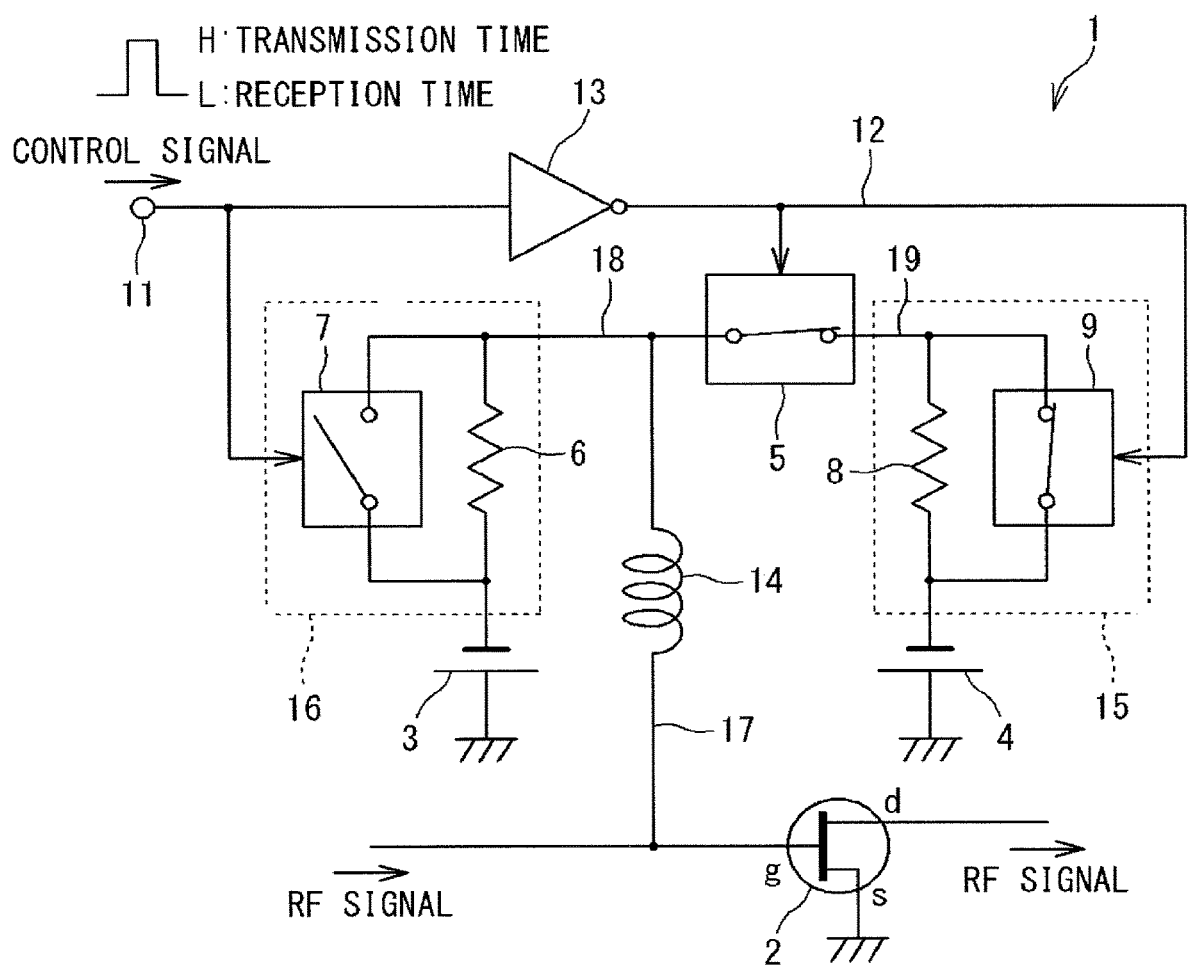
FIG. 10 is a circuit diagram showing a bias circuit according to a sixth embodiment.

FIG. 10 is a circuit diagram showing a bias circuit 1 according to a sixth embodiment.

The sixth embodiment is different from the second embodiment in that the resistance value varying unit 15 shown in the first embodiment is connected between the changeover switch 5 and the second power source 4 in the bias circuit 1 of the second embodiment. The other points are the same as in the second embodiment.

An inversion signal obtained by inverting a control signal provided to the input terminal 11 is provided to the second bypass switch 9 of the resistance value varying unit 15. Thus, the second bypass switch 9 is turned to the short-circuit state when the changeover switch 5 is in the short-circuit state, and is turned to the open state when the changeover switch 5 is in the open state.

In the present embodiment, since the second bypass switch 9 is also turned to the short-circuit state when the changeover switch 5 is in the short-circuit state, the second resistor 8 is constantly bypassed when the voltage from the second power source 4 is supplied to the power amplifier 2.

In this case, the second resistor 8 of the resistance value varying unit 15 can be caused to serve as a protective resistor for protecting the second power source 4 when a situation where a large current flows through the second power source 4 occurs for some reason.

In this configuration as well, similar to the second embodiment, on-off control of the power amplifier 2 can be appropriately performed.

In the present embodiment, the case where the second resistor 8 and the second bypass switch 9 are connected between the changeover switch 5 and the second power source 4 has been described. However, the second bypass switch 9 may be omitted, and the changeover switch 5 and the second power source 4 may be connected to each other via the second resistor 8 and a bypass path bypassing both ends of the second resistor 8.

Figure 11:
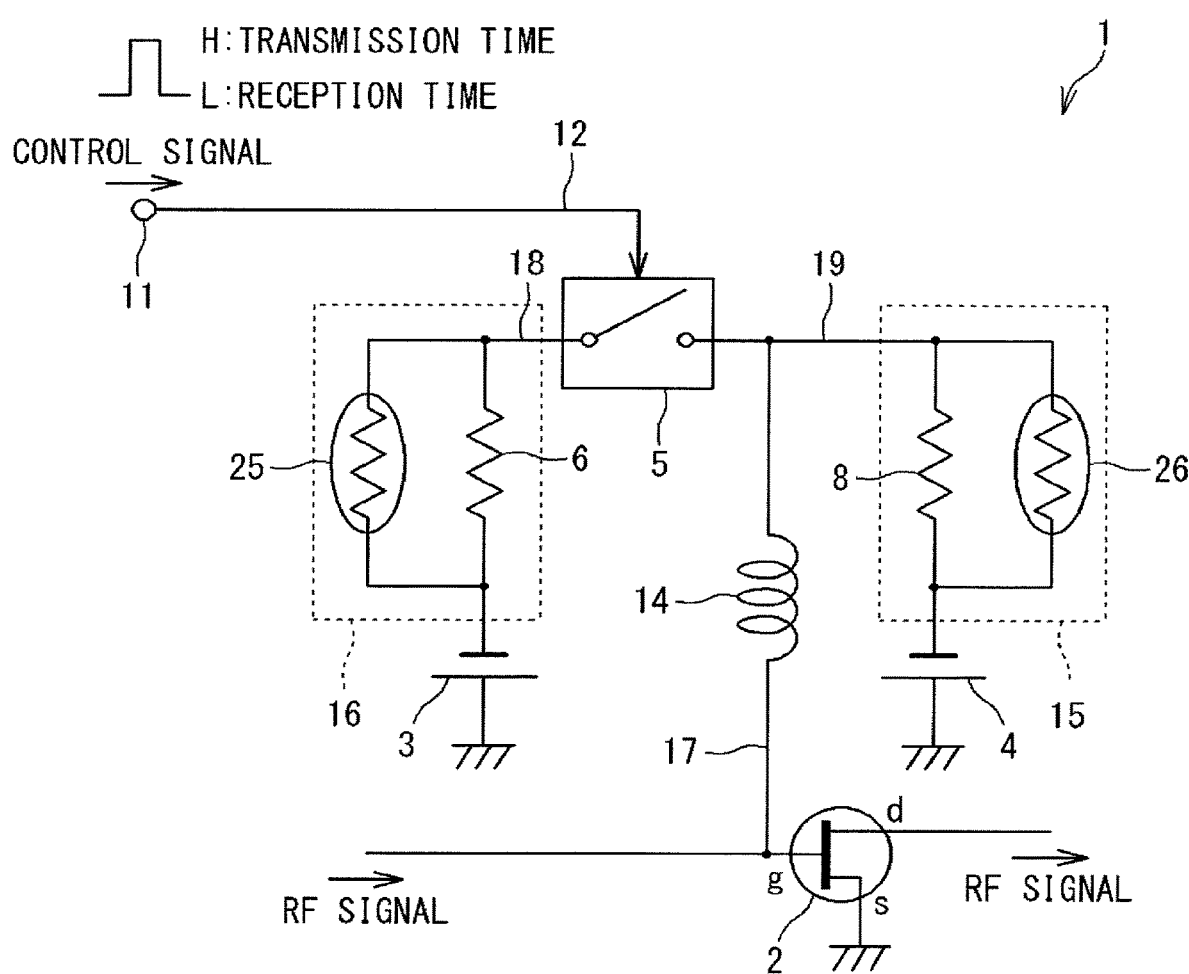
FIG. 11 is a circuit diagram showing a bias circuit according to a seventh embodiment.

FIG. 11 is a circuit diagram showing a bias circuit 1 according to a seventh embodiment.

The seventh embodiment is different from the fifth embodiment in that the resistance value varying unit 16 in the bias circuit 1 of the fifth embodiment includes a first temperature-sensitive resistor 25 instead of the first bypass switch 7 and the resistance value varying unit 15 includes a second temperature-sensitive resistor 26 instead of the second bypass switch 9.

The resistance value varying unit 16 includes the second resistor 8 and the second temperature-sensitive resistor 26 that are connected in parallel with each other. In addition, the resistance value varying unit 15 includes the first resistor 6 and the first temperature-sensitive resistor 25 that are connected in parallel with each other.

The first temperature-sensitive resistor 25 and the second temperature-sensitive resistor 26 each have a characteristic that the resistance value thereof decreases in accordance with rise of temperature.

For example, the first temperature-sensitive resistor 25 and the second temperature-sensitive resistor 26 have resistance values at normal temperature that are substantially equal to those of the first resistor 6 and the second resistor 8. When the internal temperature of the power amplifier 2 rises, the resistance values of the first temperature-sensitive resistor 25 and the second temperature-sensitive resistor 26 decrease in accordance with the rise of the internal temperature.

Thus, the resistance value R2 between both ends of the resistance value varying unit 16 is variable. In addition, the resistance value R1 between both ends of the resistance value varying unit 15 is also variable.

According to the present embodiment, even if the internal temperature of the power amplifier 2 rises and the gate current Ig of the power amplifier 2 increases, the resistance value R2 can be decreased by the second temperature-sensitive resistor 26 of the resistance value varying unit 16. Thus, occurrence of voltage division due to a resistor for power source protection as in the above conventional example can be inhibited, and occurrence of fluctuations of the gate-source voltage Vgs can be inhibited.

While the changeover switch 5 is in the open state, when the internal temperature of the power amplifier 2 falls, an increase in the gate current Ig of the power amplifier 2 is also not observed. Thus, even when the internal temperature of the power amplifier 2 falls and the resistance value of the second temperature-sensitive resistor 26 increases, the power amplifier 2 can be appropriately controlled if the gate bias voltage is continuously supplied by the second power source 4.

In addition, similarly, when the changeover switch 5 is in the short-circuit state, even if the gate current Ig of the power amplifier 2 increases, the resistance value R1 can be decreased by the first temperature-sensitive resistor 25. Accordingly, occurrence of voltage division due to a resistor for power source protection can be inhibited, and occurrence of fluctuations of the gate-source voltage Vgs can be inhibited.

Figure 12:
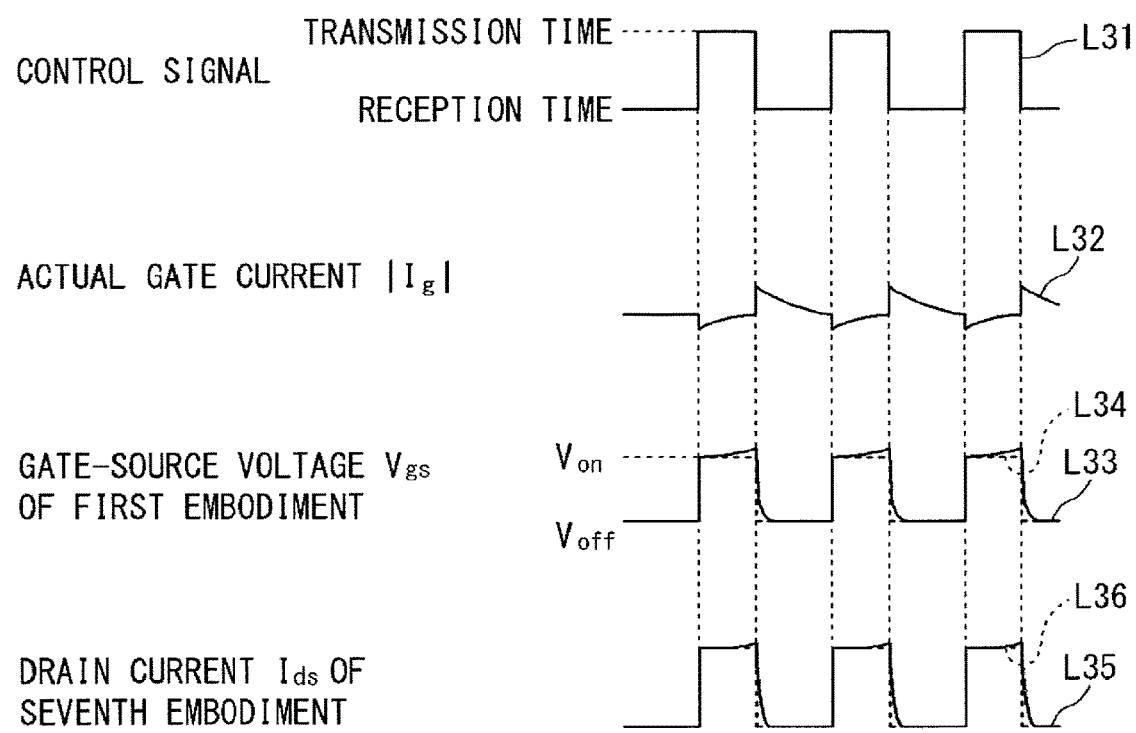
FIG. 12 is a diagram showing change of a gate-source voltage and a drain-source current when on-off control of the power amplifier is performed by each of the bias circuit of the seventh embodiment and the conventional bias circuit.

FIG. 12 is a diagram showing change of the gate-source voltage Vgs and the drain-source current Ids when on-off control of the power amplifier 2 is performed by each of the bias circuit 1 of the present embodiment and the conventional bias circuit.

In FIG. 12, a line L31 represents a control signal, a line L32 represents change of the absolute value |Ig| of the actual gate current, and the line L31 and the line L32 are the same as the line L1 and the line L7 in FIG. 3.

In addition, in FIG. 12, a solid line L33 represents change of the gate-source voltage Vgs of the present embodiment. Moreover, a broken line L34 shown so as to overlap the line L33 represents ideal change of the gate-source voltage Vgs.

When the line L33 is seen, slight distortion with respect to the ideal change is observed, but it is found that the gate-source voltage Vgs changes in substantially a rectangular wave shape in response to the control signal.

In FIG. 12, a solid line L35 represents change of the drain-source current Ids of the present embodiment. In addition, a broken line L36 shown so as to overlap the line L35 represents ideal change of the drain-source current Ids.

Regarding the drain-source current Ids as well, slight distortion with respect to the ideal change is observed, but it is found that the drain-source current Ids changes in substantially a rectangular wave shape in response to the control signal.

As described above, the bias circuit 1 of the present embodiment can also appropriately perform on-off control of the power amplifier 2.

Figure 13:
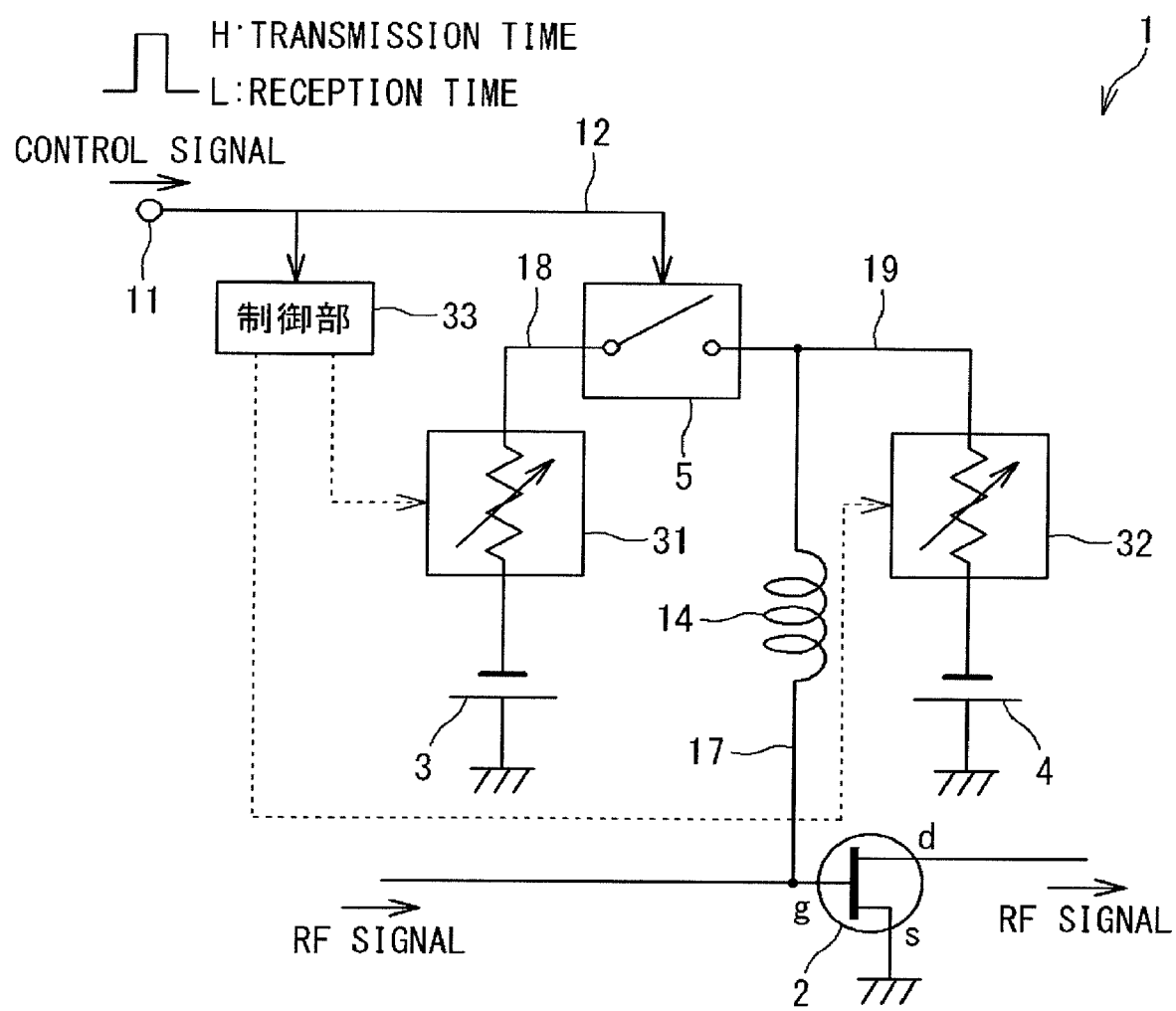
FIG. 13 is a circuit diagram showing a bias circuit according to an eighth embodiment.

FIG. 13 is a circuit diagram showing a bias circuit 1 according to an eighth embodiment.

The eighth embodiment is different from the fifth embodiment in that a first variable resistor 31 is included as the resistance value varying unit 15 in the bias circuit 1 of the fifth embodiment and a second variable resistor 32 is included as the resistance value varying unit 16.

The bias circuit 1 of the present embodiment further includes a control unit 33 for controlling the first variable resistor 31 and the second variable resistor 32.

The control unit 33 receives a control signal provided to the input terminal 11 and controls the first variable resistor 31 and the second variable resistor 32 on the basis of the control signal.

As described above, the second variable resistor 32 and the control unit 33 are connected between the second power source 4 and the power amplifier 2, and the resistance values thereof are variable.

When the changeover switch 5 is in the open state, the control unit 33 decreases the resistance value of the second variable resistor 32 to substantially 0. Accordingly, even if the internal temperature of the power amplifier 2 rises and the gate current Ig of the power amplifier 2 increases, occurrence of voltage division due to a resistor for power source protection as in the above conventional example can be inhibited, and occurrence of fluctuations of the gate-source voltage Vgs can be inhibited.

In addition, when the changeover switch 5 is in the short-circuit state, the control unit 33 decreases the resistance value of the first variable resistor 31 to substantially 0, and increases the resistance value of the second variable resistor 32 to a value at which the second power source 4 can be appropriately protected. Accordingly, even if the internal temperature of the power amplifier 2 rises and the gate current Ig of the power amplifier 2 increases, occurrence of voltage division due to a resistor for power source protection can be inhibited, and occurrence of fluctuations of the gate-source voltage Vgs can be inhibited.

As described above, by the control unit 33 appropriately controlling the first variable resistor 31 and the second variable resistor 32 on the basis of the control signal, occurrence of fluctuations of the gate-source voltage Vgs can be inhibited.

It should be noted that the embodiments disclosed herein are merely illustrative in all aspects and should not be recognized as being restrictive.

In the embodiments, the bias circuit 1 that controls the power amplifier 2 for amplifying a transmission signal has been described as an example. However, the embodiments are applicable to a power amplifier that amplifies a reception signal.

In the embodiments, the case where the power amplifier 2 is controlled to an ON state in the periods when the control signal is at the H level and the power amplifier 2 is controlled to an OFF state in the periods when the control signal is at the L level, has been described. However, the same configuration can also be adopted in the case where the power amplifier 2 is controlled to an OFF state in the periods when the control signal is at the H level and the power amplifier 2 is controlled to an ON state in the periods when the control signal is at the L level.

The scope of the present invention is defined by the scope of the claims rather than the meaning described above, and is intended to include meaning equivalent to the scope of the claims and all modifications within the scope.

REFERENCE SIGNS LIST 1 bias circuit
2 power amplifier
3 first power source
4 second power source
5 changeover switch
6 first resistor
7 first bypass switch
8 second resistor
9 second bypass switch
11 input terminal
12 signal line
13 inverter
14 coil
15 resistance value varying unit
16 resistance value varying unit
17 line
18 first branch line
19 second branch line
20 operational amplifier
21 operational amplifier
25 first temperature-sensitive resistor
26 second temperature-sensitive resistor
31 first variable resistor
32 second variable resistor
33 control unit

The invention claimed is:

1. A bias circuit configured to supply a gate bias voltage for performing on-off control of an amplifier, to the amplifier, the bias circuit comprising:
   a first power source connected in series to a gate terminal of the amplifier and configured to output a voltage required for a first gate bias voltage for turning the amplifier to an ON state;
   a second power source connected in series to the gate terminal of the amplifier and configured to output a voltage required for a second gate bias voltage for turning the amplifier to an OFF state;
   a changeover switch connected between the first power source and the amplifier and configured to supply either the first gate bias voltage or the second gate bias voltage to the amplifier by switching a state between the first power source and the amplifier to either an open state or a short-circuit state on the basis of a control signal related to on-off control of the amplifier;
   a resistor connected between the second power source and the amplifier to protect the second power source; and
   an on/off switch connected between one end and the other end of the resistor and configured to short-circuit or open both ends of the resistor on the basis of the control signal.

2. The bias circuit according to claim 1, further comprising a control unit configured to control the changeover switch and the on/off switch on the basis of the control signal.

3. The bias circuit according to claim 1, wherein the first power source and the second power source are each composed of an operational amplifier or a digital-analog converter.

* * * * *